United States Patent
Kang et al.

(10) Patent No.: US 7,342,525 B2
(45) Date of Patent: *Mar. 11, 2008

(54) SAMPLE RATE CONVERSION COMBINED WITH DSM

(75) Inventors: Chang Yong Kang, Chandler, AZ (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 5 days.

This patent is subject to a terminal disclaimer.

(21) Appl. No.: 11/385,021

(22) Filed: Mar. 20, 2006

(65) Prior Publication Data

US 2007/0146185 A1   Jun. 28, 2007

Related U.S. Application Data

(63) Continuation-in-part of application No. 11/318,271, filed on Dec. 23, 2005, now Pat. No. 7,242,326.

(51) Int. Cl.
*H03M 3/00* (2006.01)

(52) U.S. Cl. ...................... 341/143; 341/144

(58) Field of Classification Search ............ 341/50–70, 341/140–150
See application file for complete search history.

(56) References Cited

U.S. PATENT DOCUMENTS

| | | |
|---|---|---|
| 5,500,874 A | 3/1996 | Terrell |
| 5,815,102 A | 9/1998 | Melanson |
| 6,150,969 A | 11/2000 | Melanson |
| 6,184,756 B1 * | 2/2001 | Tanaka et al. .............. 332/103 |
| 6,480,129 B1 | 11/2002 | Melanson |

OTHER PUBLICATIONS

"Design of IIR Filters" (Samir V. Ginde & Joseph A.N. Noronha), Virginia Polytechnic and State University, (www.ee.vt.edu/~jnoronha/dsp_proj2_report.pdf), undated.
"Infinite Impulse Response" (http://en.wikipedia.org/wiki/Infinite_impulse_response) from Wikipedia, the free encyclopedia, undated.

* cited by examiner

*Primary Examiner*—Lam T. Mai
(74) *Attorney, Agent, or Firm*—Robert Platt Bell; Steven A. Lin

(57) ABSTRACT

Digital to Analog Conversion and sample conversion blocks are combined in order to reduce hardware and/or computational complexity. A novel DSM design is used to perform sample rate conversion. The DSM may also be used to perform other digital filtering functions, thus providing a single hardware/software technique to perform both functions. The invention includes a method and apparatus for converting input data samples provided at a first sample rate to an analog output signal. Input data samples are converted by a Delta Sigma Modulator (DSM) in a Digital to Analog Converter (DAC) to output data samples, where internal states of the DSM are updated at a second sample rate unequal to the first sample rate. At least one internal state of the DSM s modified to account for the time difference in response to a new input sample arriving at a time different from an update of the internal states of the DSM.

18 Claims, 10 Drawing Sheets

SAMPLE RATE CONVERSION COMBINED WITH DSM

CROSS-REFERENCE TO RELATED APPLICATIONS

The present application is a Continuation-In-Part (CIP) of co-pending U.S. patent application Ser. No. 11/318,271 filed on Dec. 23, 2005 now U.S. Pat. No. 7,242,326, and incorporated herein by reference.

FIELD OF THE INVENTION

The present invention relates to a method and apparatus for performing sample rate conversion. In particular, the present invention is directed toward a technique and apparatus for combining digital sample rate conversion with a DSM or A/D converter.

BACKGROUND OF THE INVENTION

Delta-sigma modulators (noise shapers) are particularly useful in digital to analog and analog to digital converters (DACs and ADCs). Using oversampling, a delta-sigma modulator spreads quantization noise power across the oversampling frequency band, which is typically much greater than the input signal bandwidth. Additionally, a delta sigma modulator performs noise shaping by acting as a lowpass filter to the input signal and a highpass filter to the noise; most of the quantization noise power is thereby shifted out of the signal band. U.S. Pat. No. 5,815,102 entitled "Delta Sigma PWM DAC to Reduce Switching" to John Melanson granted Sep. 29, 1998 and U.S. Pat. No. 6,150,969 entitled "Correction of Nonlinear Output Distortion in a Delta Sigma DAC" to John Melanson granted on Nov. 21, 2000 and U.S. Pat. No. 6,480,129 entitled "Methods and Apparatus for Correction of Higher Order Delta Sigma Converters" to John Melanson granted on Nov. 12, 2002 disclose exemplary ways for implementing the modulator and are incorporated herein by reference.

In addition to data conversion applications, delta-sigma noise shapers are increasingly utilized in the design of digital amplifiers. In one particular technique, a digital delta-sigma noise shaper provides a noise shaped (quantized) digital data stream to a pulse width (duty cycle) modulated (PWM) stream, which in turn drives a linear amplifier output stage and associated load. This technique is generally described in U.S. Pat. No. 5,784,017, entitled "Analogue and Digital Convertors Using Pulse Edge Modulators with Non-linearity Error Correction", granted Jul. 21, 1998, and U.S. Pat. No. 5,548,286, entitled "Analogue and Digital Convertor Using Pulse Edge Modulators with Non-linearity Error Correction", granted Aug. 20, 1996, both to Craven, U.S. Pat. No. 5,815,102, entitled "Delta Sigma PWM DAC to Reduce Switching", granted Sep. 29, 1998, U.S. patent application Ser. No. 09/163,235 to Melanson, and International Patent Application No. PCT/DK97/00133 by Risbo, all of which are incorporated herein by reference.

Another example is disclosed in U.S. Pat. No. 6,480,129 entitled "Methods and Apparatus for Correction of Higher Order Delta Sigma Converters" to John Melanson granted on Nov. 12, 2002, and incorporated herein by reference, which teaches reducing EMI through dithering. Additionally, these techniques only marginally reduce the audio signal quality.

U.S. Pat. No. 6,384,761 to Melanson, issued May 7, 2002 and incorporated herein by reference discloses a Second and higher order dynamic element matching in multibit digital to analog and digital to analog data converters A multibit data converter has an output parallel unit element converter fed by a multibit signal, and noise shaping dynamic element matching (DEM) apparatus for selectively activating units in the converter. The DEM apparatus includes a plurality of noise shaping components. Each component has as an input one signal to the converter, and each includes a first integrator having as its input the input to the component, and a second integrator having as its input the output of the first integrator, and forms one or more component outputs. A signal in the second integrator is clipped. A vector quantizer orders the component outputs and activates converter elements according to the ordering.

Sample-rate conversion (SRC) refers to the process of translating a sequence of discrete data samples with a certain sampling rate into another sequence with a different sampling rate, while preserving the information contained in the original sequence. Sample rate conversion can be a relatively simple technique where the two sample rates are related by a fairly small integer ratio. For example, if the ratio of sample rates is 4:5, the input signal only needs to be upsampled by a factor of four and then, after appropriate filtering, down-sampled by a factor of five.

FIG. 1 illustrates an example of such a Prior Art sample rate conversion technique. In this Prior Art embodiment, input data may be upsampled by a factor of M in upsampler 110, to produce an upsampled data stream. Upsampling may comprise the process of creating new intermediate samples by inserting samples of value zero as intermediate values. Upsampled data may be filtered in low pass filter 120, which may comprise a digital filter. The resultant data may be downsampled by a factor of N in downsampler 130 which may decimate unwanted data samples. Downsampling may comprise decimating (eliminating) intermediate sample values to create a new sample set at the desired output sample rate.

Low pass filter 120 may be used to eliminate spectral "images" produced when upsampling. Such images are illustrated in FIG. 2. Referring to FIG. 2, the sample data at rate $f_s$ is illustrated, along with image data produced during upsampling at sample rates $2fs$ and $3fs$. FIG. 3 illustrates how filtering may be used to eliminate undesirable images while preserving desirable data, as illustrated in FIG. 4 to produce sample rate converted data as illustrated in FIG. 5.

In the example given above for a ratio of sample rates of 4:5, M would equal 4 and N would equal 5. Such a Prior Art sample rate conversion technique may be suitable for relatively simple rate conversions. However, not all scenarios where sample rate conversion is desired have such simple sample rate ratios. For example, when converting by more drastic ratios (e.g., 124:359) the amount of processing required to upsample and then downsample may be prohibitive.

As compared to the simpler scenario where the sampling rates are related by a relatively simple ratio, the term "asynchronous sample-rate conversion" is often used to signify situations where the ratios are rather ill-defined numbers such that their least common multiple is a very large number. Asynchronous sample rate conversion is particularly applicable in cases where data is at the "same" sampling rate, but created with a different clock crystal, and thus at a slightly different sampling frequency. Thus, one set of data might have a sample rate of a "fast" 48 KHz and another might have a sample rate of a "slow" 48 KHz. Such ratios like this that are close to 1:1, but not exact, fall into the category of "asynchronous sample-rate conversion."

Asynchronous sample-rate converters are commonly used when bridging two systems that are on different sampling rates and/or master operating clocks.

Additionally, in the field of audio, there are various standards that utilize different sampling rates such as 32 KHz, 44.1 KHz, 48 KHz, and so on, and sample rate converters are commonly used to interconnect different systems with the different standards.

There have been proposed different methods of sample rate conversion. FIGS. 6-10 illustrate the operation of one such Prior Art sample rate conversion scheme. As illustrated in FIG. 6, such a sample rate converter interpolates (i.e., upsamples) a source signal Fsi 1205 in xU interpolator 1210 to a higher sample rate (either physically or conceptually) so that it can represent the original analog signal within a prescribed error bound. FIG. 7 represents the frequency distribution of the input signal Fsi at the input sample rate. A reconstruction filter 1220 eliminates artifacts present in the up-sampled signal. FIG. 8 illustrates the reconstruction filter response as applied to the interpolated signal. The upsampled signal is then re-sampled in downsampler 1230 at a certain multiple D of the desired rate Fso. The re sampled sequence is then further decimated down by decimator 1240. FIG. 9 illustrates the action of the decimation filter. The resultant data Fso at the output sample rate is output 1250 as illustrated in FIG. 10.

SUMMARY OF THE INVENTION

In the present invention, Digital to Analog Conversion and sample conversion blocks are combined in order to reduce hardware and/or computational complexity. A novel DSM design is used to perform sample rate conversion. The DSM may also be used to perform other digital filtering functions, thus providing a single hardware/software technique to perform both functions. The invention includes a method and apparatus for converting input data samples provided at a first sample rate to an analog output signal. Input data samples are converted by a Delta Sigma Modulator (DSM) in a Digital to Analog Converter (DAC) to output data samples, where internal states of the DSM are updated at a second sample rate unequal to the first sample rate. At least one internal state of the DSM s modified to account for the time difference in response to a new input sample arriving at a time different from an update of the internal states of the DSM.

DETAILED DESCRIPTION OF THE INVENTION

Figure 1:
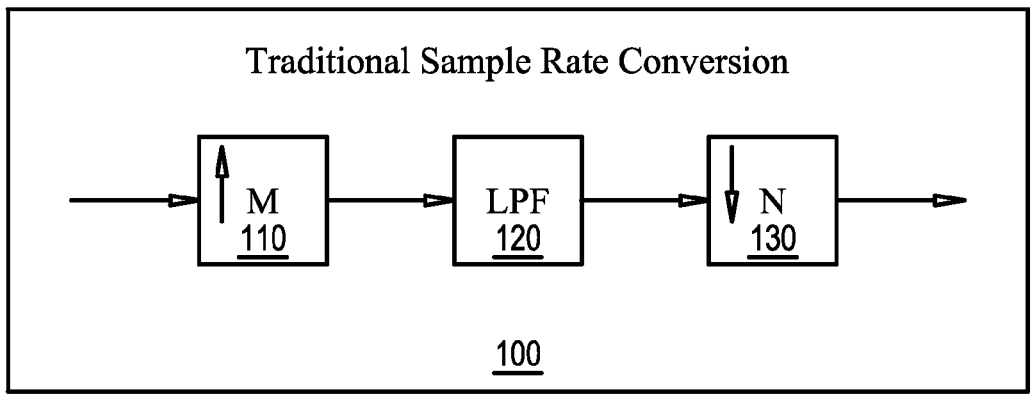
FIG. 1 is a block diagram illustrating how traditional sample rate conversion is performed.
Figure 2:
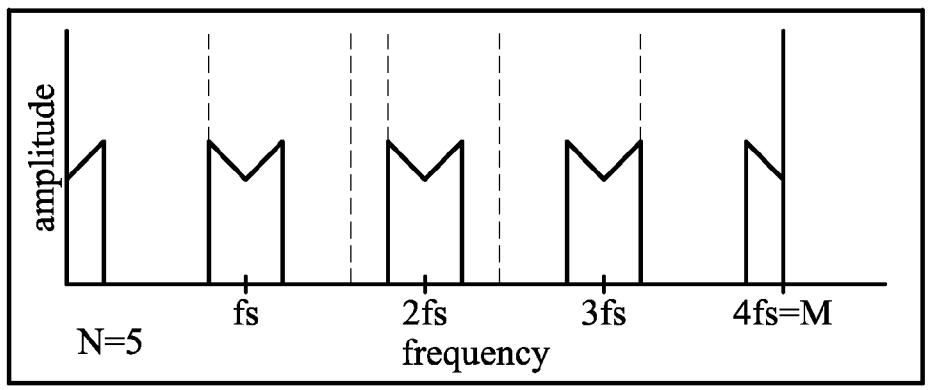
FIG. 2 is a spectrum diagram illustrating the resulting data and artifacts produced after upsampling the input digital signal.
Figure 3:
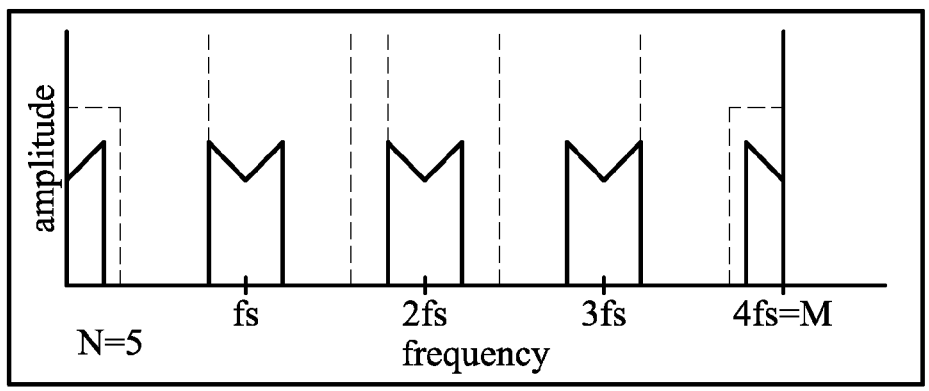
FIG. 3 is a spectrum diagram illustrating the resulting data and artifacts produced after upsampling the input digital signal, highlighting the desired data portion of upsampled digital signal.
Figure 4:
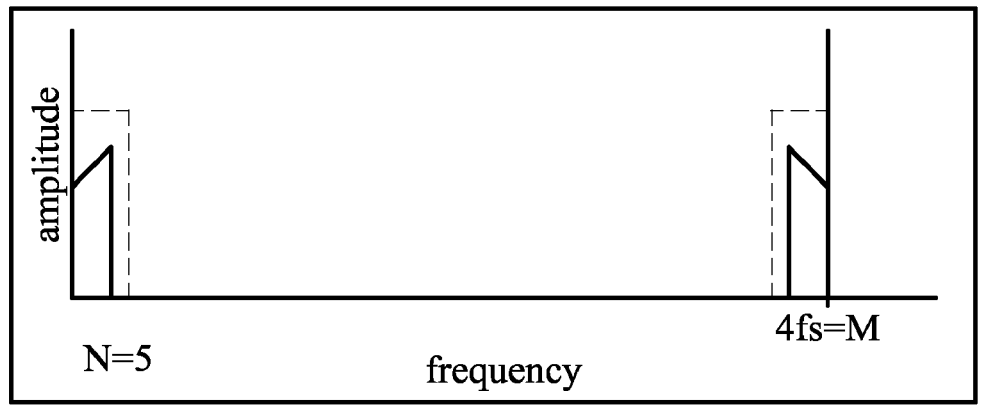
FIG. 4 is a spectrum diagram illustrating the resulting data after artifacts have been filtered out with a low pass filter.
Figure 5:
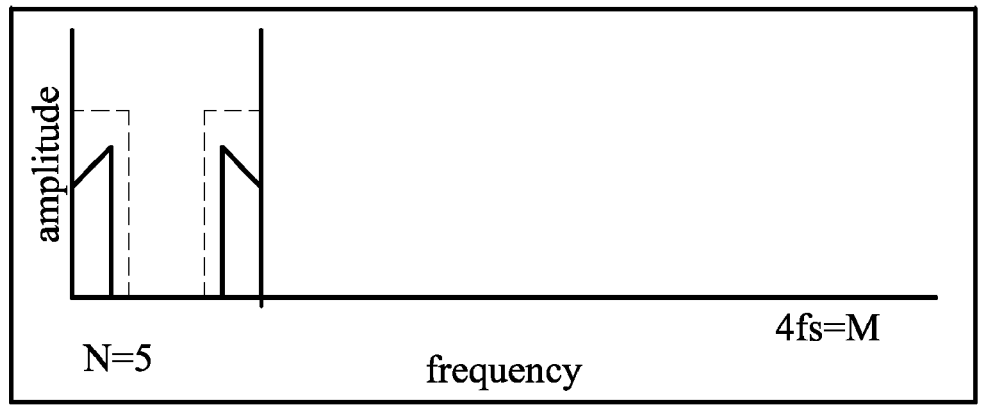
FIG. 5 is a spectrum diagram illustrating the resulting data after sample rate conversion.
Figure 6:
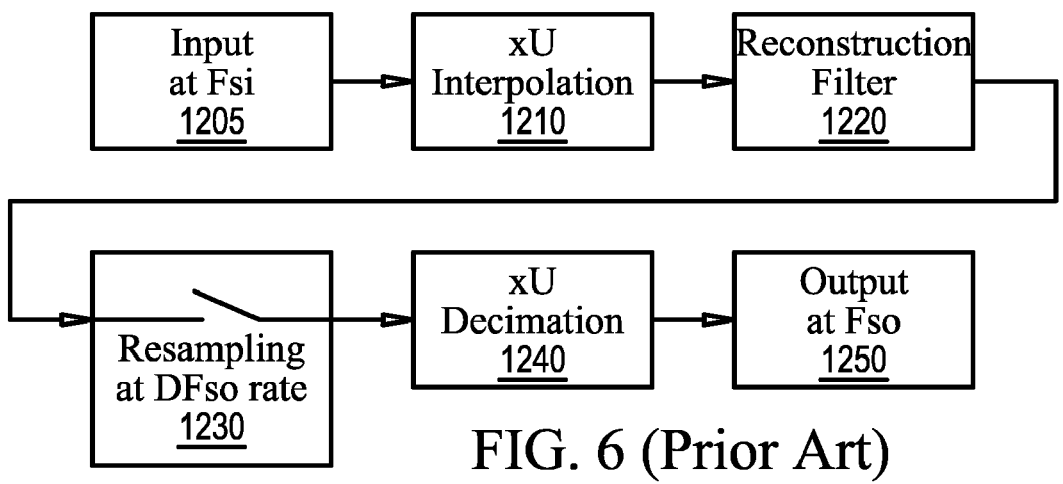
FIG. 6 is a block diagram illustrating a Prior Art technique of sample rate conversion.
Figure 7:
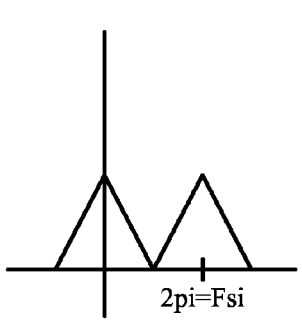
FIG. 7 represents the frequency distribution of the input signal Fsi at the input sample rate in the Prior Art technique of FIG. 6.
Figure 8:
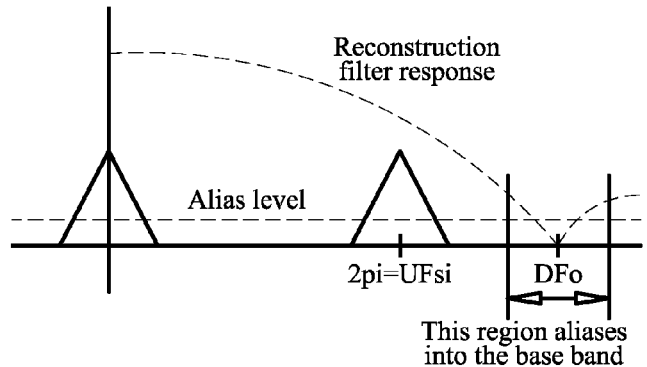
FIG. 8 illustrates the reconstruction filter response as applied to the interpolated signal in the Prior Art technique of FIG. 6.
Figure 9:
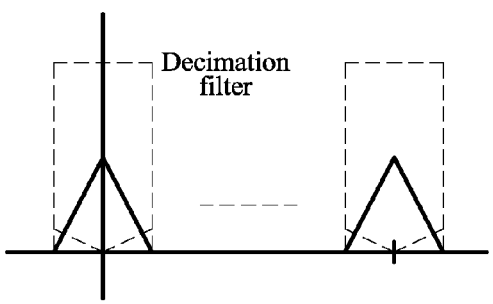
FIG. 9 illustrates the action of the decimation filter in the Prior Art technique of FIG. 6.
Figure 10:
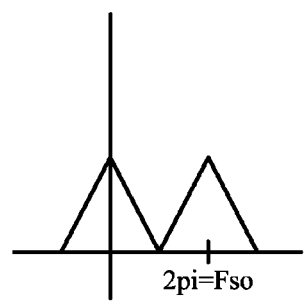
FIG. 10 illustrates the resultant data $F_{so}$ at the output sample rate from the Prior Art technique of FIG. 6.
Figure 11:
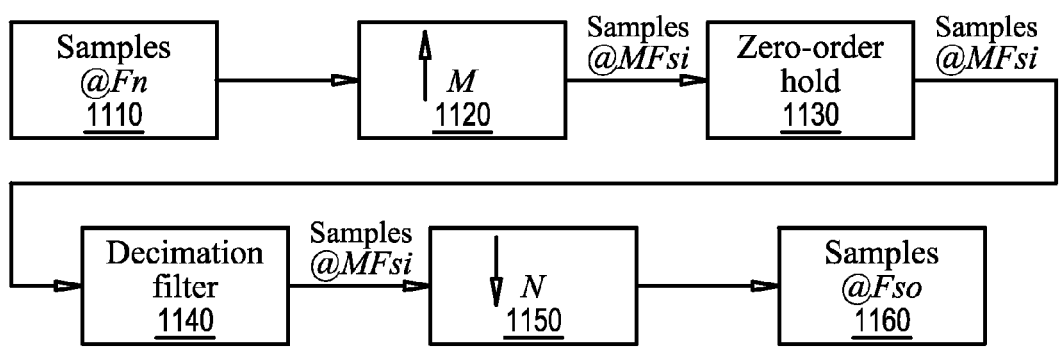
FIG. 11 is a block diagram illustrating the sample rate conversion method of the present invention.
Figure 12:
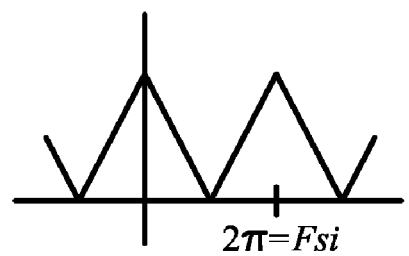
FIG. 12 is a frequency domain diagram illustrating the input data as input into the sample rate conversion method of FIG. 11.
Figure 13:
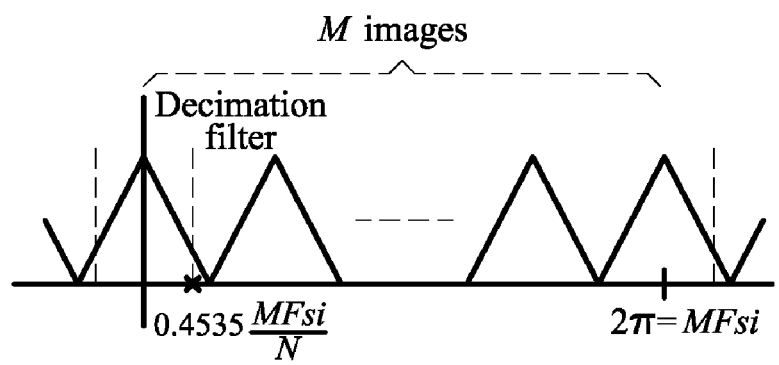
FIG. 13 is a frequency domain diagram illustrating the results of interpolating the input data of FIG. 12 and illustrating the application of the decimation filter to the upsampled signal.
Figure 14:
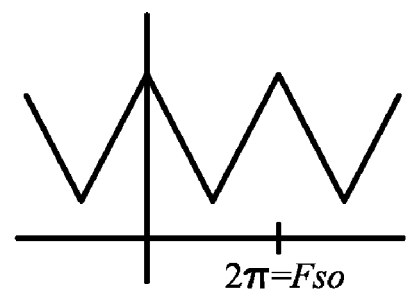
FIG. 14 is a frequency domain diagram illustrating the results of decimating the data of FIG. 13 to produce the sample rate converted data.

For the purposes of illustration, a sample-rate conversion situation by a ratio of MIN is used, where M and N are integers and the ratio MIN represents the ratio of the input sample rate to the output sample rate. A straightforward approach would be to interpolate (upsample) by a factor of M and then decimate (down sample) by a factor of N. To further simplify the example, N is set to be greater than M. FIGS. 11-14 illustrate a block diagram and frequency domain view of the process. In FIG. 11, input samples 1110 at sample rate $F_{si}$ are fed to upsampler 1120 which upsamples the input data by factor M. The resultant samples at sample rate $MF_{si}$ are then fed, in sequence, to Zero-order hold 1130 and decimation filter 1140. The resultant samples are then fed to downsampler 1150 which downsamples the data by factor N to produce sample rate converted data 1160 at sample rate $F_{so}$.

There are a few observations to be made from the illustration of FIGS. 11-14. First, for the situation described, there is no need for an interpolation filter, as simple repetitions of samples will suffice to upsample the input date. Second, after the upsampling, a decimation filter may be used before downsampling. The bandwidth of the decimation filter should scale according to N.

More specifically, the decimation filter may comprise a low-pass filter having a certain pass band (for audio applications, 0.4535Fso) when N=1, and it should scale to $$\frac{0.4535 F_{so}}{N}$$

as N changes. The realization of such filter scaling can be best understood in terms of the state-variable representation of a filter. In the state-variable representation, a filter is defined by a set of matrix equations as follows:

$$X_{n+1} = A \cdot X_n + B \cdot u_n \quad (1)$$

$$y_n = C \cdot X_n + D \cdot u_n \quad (2)$$

The current state $X_n$ and the current input $u_n$ of the filter determines the next state $X_{n+1}$ and the output $y_n$ of the filter.

Filters with different characteristics, including low-pass filters, can be designed by properly fixing the A, B, C, and D matrices, and a subset of low-pass filters designed in this context frequency-scale as the A matrix is raised to the power of 1/N. For example, the following set of matrices-implements an 8th-order Butterworth low-pass filter with the −3 dB cutoff at 0.18Fs.

$$A = \begin{pmatrix} 5.1801 & -12.0844 & 16.4968 & -14.3630 & 8.1455 & -2.9324 & 0.6117 & -0.0565 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{pmatrix}$$

$B = (1\ 0\ 0\ 0\ 0\ 0\ 0\ 0)^T$
$C = (0\ 0\ 0\ 0.0020\ 0\ 0\ 0\ 0)$
$D = (0)$

Figure 15:
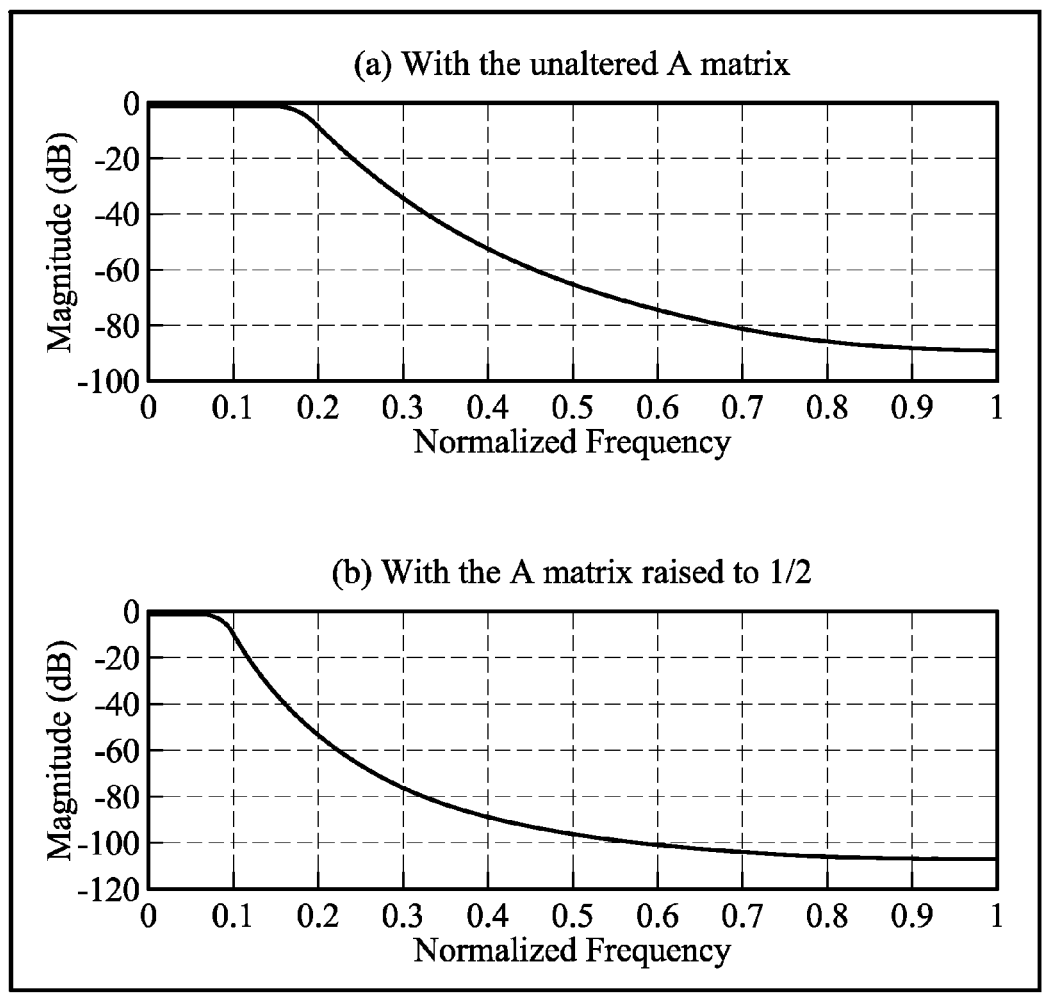
FIG. 15 illustrates the frequency response plots of the filter with the unaltered A matrix and with $A^{1/2}$.

For this particular set of matrices, the state variables are simply shifted at each update, with the new value for the first state variable being the weighted sum of all the current state variables and the input. However, this particular construction or topology of the filter is not important for the discussion at hand. The frequency-scaling behavior of the filter is illustrated in FIG. 15 which shows the frequency response plots of the filter with the unaltered A matrix and with $A^{1/2}$, where the second plot confirms that the passband is reduced by the factor of 2. (There also is a magnitude scale factor of N when the A matrix is raised to the power of 1/N, which can easily be corrected in the B matrix.)

With such a scaling filter available, the M/N sample-rate conversion can be mathematically described as follows. First, the input sequence $u_n$ is upsampled and zero-order held by M. To represent this new sequence, a new input sequence $v_{Mxi+j} = u_{i \cdot j}$ is defined, where i refers to the sequence number in $u_n$ and j the interpolated input sequence number ($0 \leq j \leq M-1$). In the same context, a new state-variable sequence $X_{i \cdot j}$ is defined, where i refers to the sequence number in $X_n$ and j the interpolated sequence number ($0 \leq j \leq N-1$). Then, N state-variable updates are:

$X_{n \cdot 1} = A^{1/N} X_{n \cdot 0} + B v_{N \times n}$ $X_{n \cdot 2} = A^{1/N} X_{n \cdot 1} + B v_{N \times n+1}$ $X_{n \cdot 3} = A^{1/N} X_{n \cdot 2} + B v_{N \times n+2}$

. . .

. . .

$X_{n \cdot (N-1)} = A^{1/N} X_{n(N-2)} + B v_{N \times n+(N-2)}$ $X_{(n+1) \cdot 0} = A^{1/N} X_{n(N-1)} + B v_{N \times (n+1)}$ The $N \cdot F_{s0}$ decimation filter output is to be decimated by N. In other words, only one sample at every N samples of the decimation filter output is needed, and explicitly evaluating samples in between is not needed. Based on this observation, the N updates of the state variables can be merged as follows.

$$X_{n+1 \cdot 0} = A \cdot X_{n \cdot 0} + A^{\frac{N-1}{N}} \cdot B \cdot v_{N \times n} +$$

$$A^{\frac{N-2}{N}} \cdot B \cdot v_{N \times n+1} + \cdots + A^{\frac{1}{N}} \cdot B \cdot v_{N \times n+(N-1)}$$

-continued $$= A \cdot X_{n \cdot 0} + \left( A^{\frac{N-1}{N}} \cdot B \cdot z^{-(N-1)} + \right.$$

$$\left. A^{\frac{N-2}{N}} \cdot B \cdot z^{-(N-2)} + \cdots + A^{\frac{1}{N}} \cdot B \cdot z^{-1} + B \right) \cdot$$

$v_{N \times n}$

The final form of the "rate-conversion filter" equations are:

$$X'_{n+1} = A \cdot X'_n + B' v_{N \times n} \quad (3)$$

where $X'_n = X_{n \cdot 0}$ $Y'_n = Y_{n \cdot 0}$ $B' = A^{\frac{N-1}{N}} \cdot B \cdot z^{-(N-1)} + A^{\frac{N-2}{N}} \cdot B \cdot z^{-(N-2)} + \cdots + A^{\frac{1}{N}} \cdot B \cdot z^{-1} + B$ The merged form of the equations above looks exactly the same as the original equations in (1) and (2), except for the B' matrix, which can be simplified as follows. (K denotes the order of the filter.)

$$B' = \begin{pmatrix} \sum_{i=0}^{N-1} C_{0-i} \cdot z^{-i} \\ \sum_{i=0}^{N-1} C_{1-i} \cdot z^{-i} \\ \cdot \\ \cdot \\ \cdot \\ \sum_{i=0}^{N-1} C_{k-i} \cdot z^{-i} \end{pmatrix}$$

Each element in the matrix is a finite impulse response (FIR) filter construction so that, for each state variable being updated, the interpolated inputs over one period of $F_{so}$ are weighted and summed, and the result is added to the state variable.

A further generalization of the above idea to the asynchronous sample-rate conversion is achieved when M and N become large enough to consider the interpolated sequence continuous. Then, the "weights" on the interpolated inputs also become a continuous curve and the summation of the weighted samples now becomes an integration. To further extend the discussion in this context, related functions are defined as follows:

$$W_k(t): \text{the weight curve defined over } \left[0, \frac{1}{F_{so}}\right]$$

$$I_k(t) = \int_0^t W_k(x) \cdot dx, \, 0 \le t \le \frac{1}{F_{so}}$$

Figure 16:
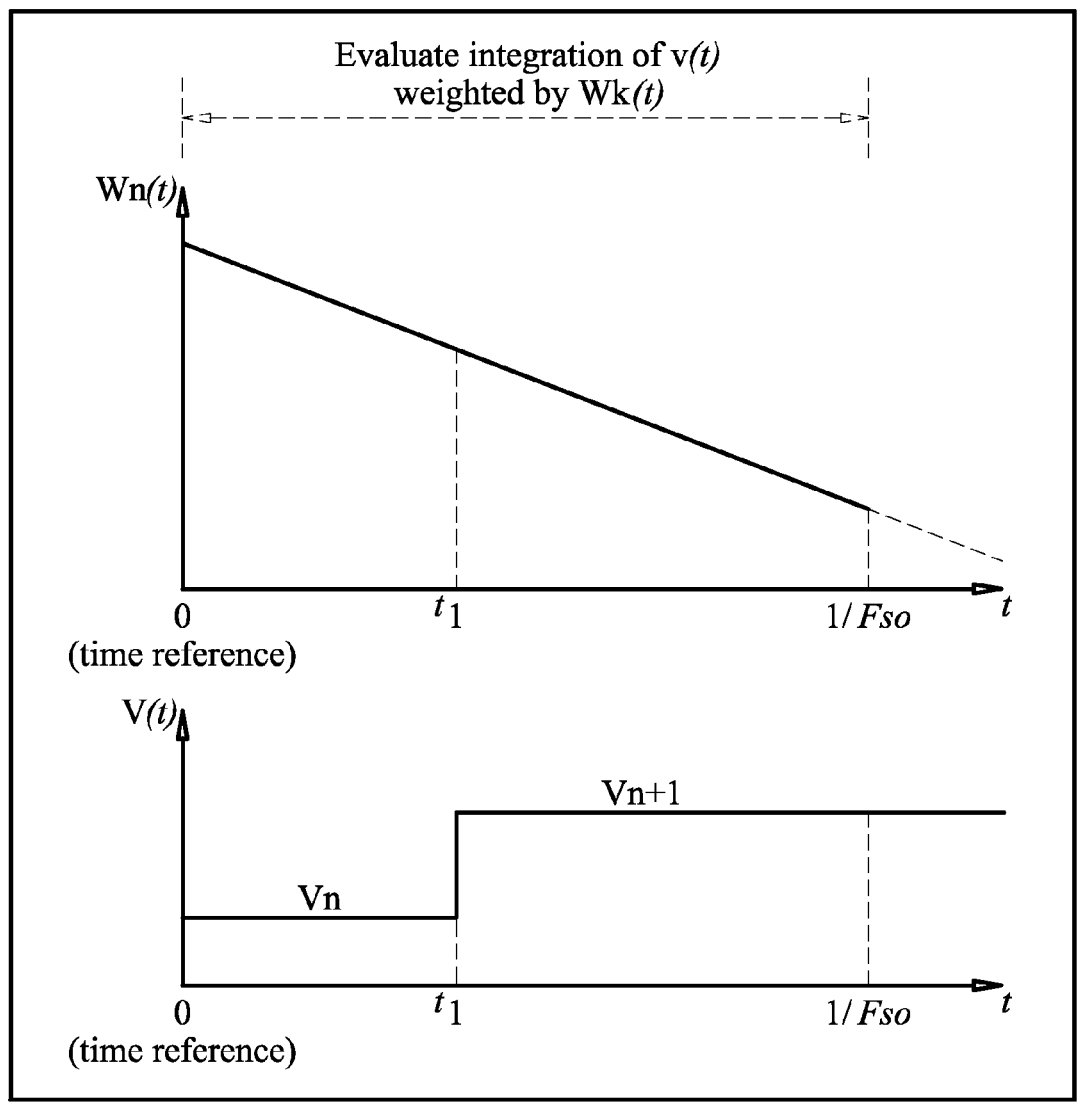
FIG. 16 illustrates a typical scenario of the integration for one state variable update.

Also, a system-level assumption is made in which the conversion ratio $F_{so}/F_{si} > \frac{1}{2}$. This assumption implies that over the span of the integration, only one data value can change at most. A typical scenario of the integration for one state variable update is illustrated in FIG. 16. Mathematically, this integration can be written as follows:

$$\int_0^{\frac{1}{F_{so}}} v(t) W_k(t) \cdot dt = (v_n - v_{n+1}) \cdot I_k(t_1) + v_{n+1} \cdot I_k\left(\frac{1}{F_{so}}\right)$$

Figure 17:
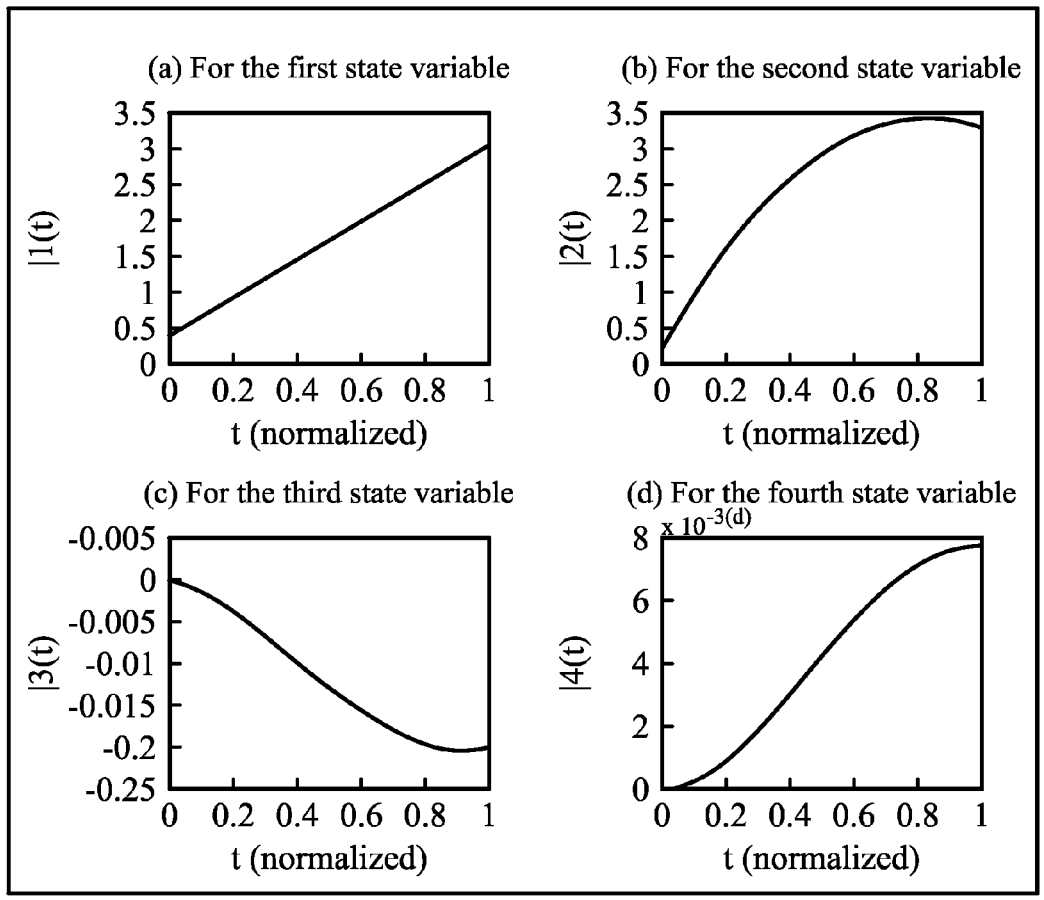
FIG. 17 illustrates plots of polynomials for the first four state variables of the 8th-order scaling filter.

The integration function $I_k(t)$ can be obtained (or approximated), by means of a statistical method, as a kth-order polynomial that "best fits" the discrete sample points of the function. In practice, higher-order polynomials can be ignored altogether in actual implementation while maintaining the acceptable performance. As an illustration, the plots of the polynomials for the first four state variables of the 8th-order scaling filter previously presented are shown in FIG. 17.

The two limiting assumptions previously made on the $F_{so}/F_{si}$ are now addressed. To address the first assumption that N>M, what happens when N<M must be considered. In this case, the bandwidth for $F_{so}$ which is also the bandwidth of the decimation filter, can be wider than the bandwidth for $F_{si}$, thereby allowing the tail of the first image to remain in the passband of the filter. Therefore, to deal with the overall up-conversion cases, it is necessary to filter out the first images of the upsampled input stream using an interpolation filter. The number of images to be filtered out depends on the ratio of the input and output passband widths. The second assumption that $F_{so}/F_{si} > \frac{1}{2}$ can easily be made valid by appropriately interpolating and/or zero-order-holding the $F_{si}$ samples, effectively rendering the input frequency for the SRC In sum, an overall diagram of the new sample rate conversion method is shown in FIG. 18.

Figure 18:
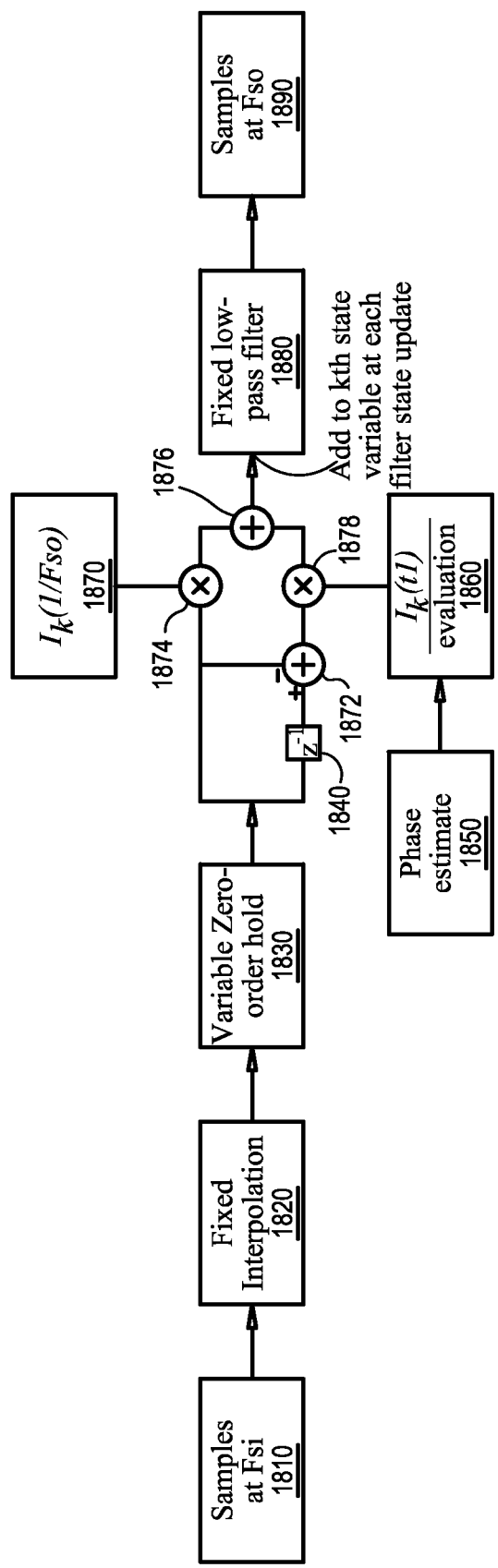
FIG. 18 is an overall diagram of the new sample rate conversion method.

Referring to FIG. 18, input samples 1810 at sample rate $F_{si}$ are fed to fixed interpolator 1820, which interpolates the samples by a factor M. The resultant samples at sample rate $MF_{si}$, are then fed, in sequence, to Zero-order hold 1830.

The apparatus of FIG. 18 implements the operations in accordance with the equation set forth. Specifically, elements 1840 and 1872 implement (Vn–Vn+1), output of which is then multiplied with the output of element 1860. Element 1860 implements Ik(t) function, and element 1850 calculates the input to the function, t1, according to the relative phase of the output sample. Likewise, elements 1870 and 1874 implement the second term of the equation, Vn+1*Ik(1/Fso). For the second term, the argument to the Ik(t) function is a constant, 1/Fso, so that the function output is also a constant and no explicit computation is necessary. The outputs of the two terms are then summed by element 1876.

The resultant samples are then fed to fixed low-pass filter 1880 which filters the data by factor N to produce sample rate converted data 1890 at sample rate $F_{so}$.

The SRC method of the present invention can result in a substantial hardware saving in digital-to-analog (DAC) applications that use the delta-sigma modulation (DSM) technique. In most digital-to-analog conversion (DAC) applications, the output analog anti-aliasing filter components are fixed and cannot be changed on the fly during operation. For those situations, it is necessary to set the output sample rate of the DAC to a constant frequency $F_{so}$ such that the analog filter can be designed to achieve a certain response. This constant frequency can be troublesome if the system has to deal with multiple standards that have different source sample rates. For example, in the field of audio, there are multiple standards in use with sample rates of 32 KHz, 44.1 KHz, 48 KHz, and so on. To reconcile the conflicting requirements of both frequency rates in such an application, a sample-rate converter is commonly used as a bridge. The role of the SRC is to translate the source sample rate to the output sample rate of the DAC to which the analog filter is tuned. The statement also generally holds true for the digital-to-analog converters that utilize the delta-sigma modulation (DSM) techniques.

Delta-sigma modulation is a technique that trades the resolution of the data with the rate of the data. According to the Nyquist sampling theorem, the information in a continuous signal can be preserved if sampled, as long as the sampling frequency is greater than the double the signal frequency. In DSM, the signal is sampled at a much higher rate than necessary (oversampling), and, instead, the resolution of each sample is reduced (even down to 1 bit). This resolution reduction is possible because the noise introduced by reducing the resolution (quantization noise) is pushed out of the band of interest thereby maintaining the signal purity in the band of interest, a property generally known as "noise shaping."

A DSM is ultimately characterized by its noise transfer function (NTF) and signal transfer function (STF). The NTF determines how the quantization noise will be shaped, while the STF determines how the signal in the band of interest will be shaped. Without exception, the NTF has a shape that is highly attenuated in the passband and rises steeply at a certain frequency beyond the passband. For STF, it is desirable to have a response as flat as possible in the passband to preserve the signal integrity. A DSM can be designed to have a flat STF response across the whole spectrum, or to have a low-pass response that rolls off after the passband.

The crucial block of the new SRC method described above is the state-variable low-pass filter that is capable of the frequency scaling. While generally this frequency-scaling low-pass filter needs to be built separately thereby making this new method no more attractive than other more commonly used approaches, it is possible to build a DSM that has a STF that exhibits the frequency-scaling low-pass property. Therefore, for the DSM DAC applications that require a front-end SRC, the already-existing DSM hardware can be utilized to replace the decimation stage of the proposed SRC method, thereby saving overall hardware. An 8th- order Delta-Sigma Modulator (DSM) is illustrated in FIG. 19, which is intended for an audio application with a 20 KHz signal bandwidth at the $F_{so}$ frequency of 384 KHz.

Figure 19:
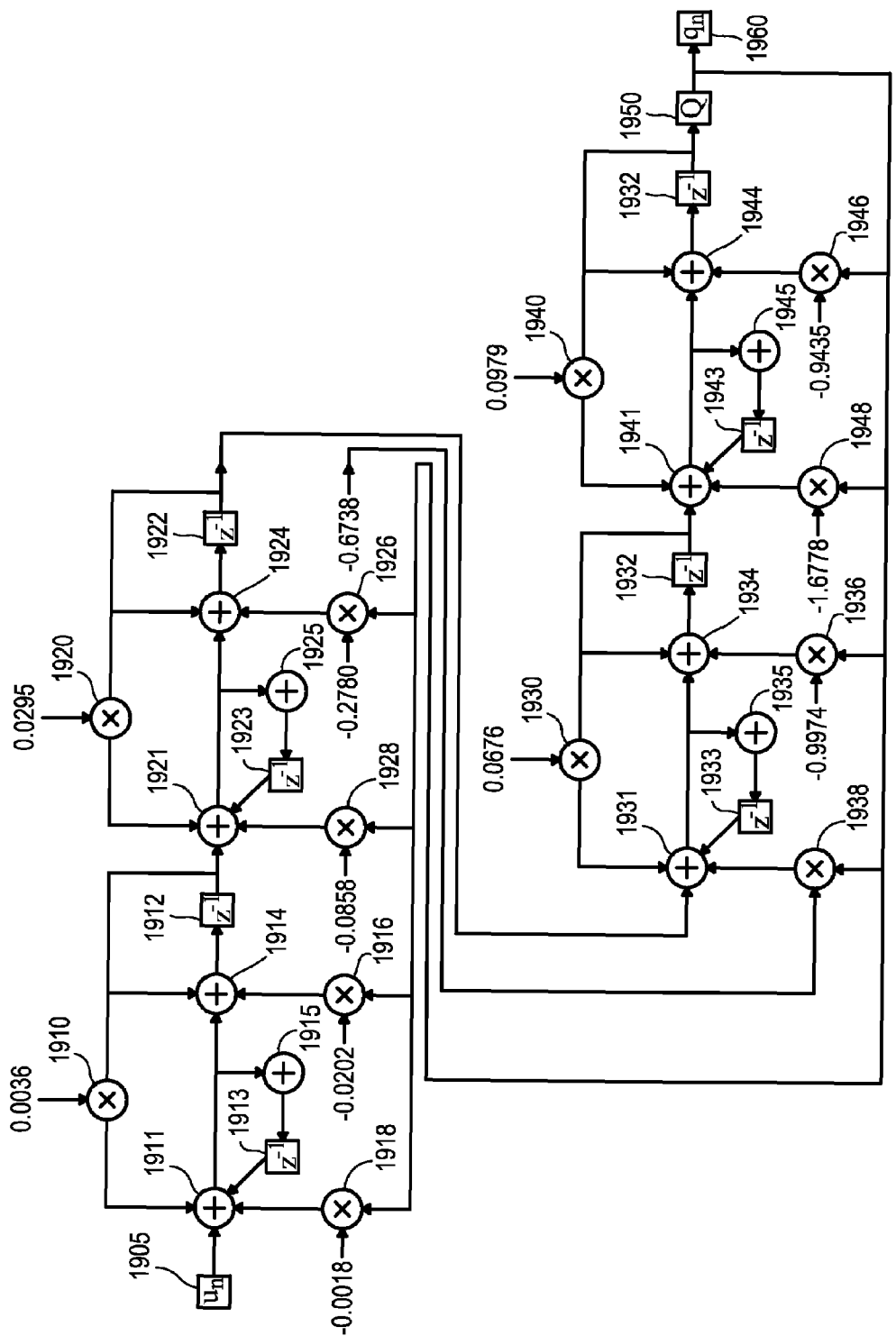
FIG. 19 is a block diagram of an 8th- order DSM, which is intended for an audio application with a 20 KHz signal bandwidth at the $F_{so}$ frequency of 384 KHz.

Referring to FIG. 19, each $z^-1$ component 1913, 1912, 1923, 1922, 1933, 1932, 1943, and 1942 represents a state variable, so that it is an 8-th order DSM because it has 8 state variables. All the multipliers 1910, 1920, 1930, 1940, 1918, 1916, 1928, 1926, 1938, 1936, 1948, and 1946 and adders 1911, 1914, 1915, 1921, 1924, 1925, 1931, 1934, 1935, 1941,1944, and 1945, together with their connections, prescribe how these state variables are updated at each clock cycle. Various coefficients are illustrated for multipliers 1910, 1920, 1930, and 1940, as well as adders 1918, 1928, 1938, and 1948 by way of example only. The DSM topology shown is commonly known as the "cascade-of-resonators, feedback (CRFB)" form, because the construction unit represented by components 1910, 1911, 1912, 1913, 1914, 1915, 1916, and 1918 is a resonator which has the feedback input from the output, and the overall DSM is constructed by cascading this unit multiple times. Input data samples $u_n$ 1905 are fed to the DSM and the output $q_n$ 1960 is generated from the Quantizer 1950.

The module may advantageously include other features into the same DSM including: PWM nonlinearity correction feedback, $F_{so}$ so frequency hopping by switching quantization levels are between 65 and 73 to avoid AM frequency interference, and single master clock operation that does not require any other oversampling $F_{si}$ and $F_{so}$ clocks. The module achieves less than −90 dB typical THD+N with a greater than 90% modulation index. A prototype emulation platform demonstrated a greater than 102 dB dynamic range.

The STF of the DSM can be described by the same state-variable representation shown in (1) and (2) with the following matrices.

$$A = \begin{pmatrix} 0.7598 & 0.5000 & 0.7046 & 0 & 0.3041 & 0 & 0 & 0 \\ -0.4405 & 0.7598 & 0.3312 & 0 & 0.1429 & 0 & 0 & 0 \\ 0 & 0 & 0.6519 & 0.5000 & 0.5626 & 0 & 0 & 0 \\ 0 & 0 & -0.2109 & 0.6519 & 0.2757 & 0 & 0 & 0 \\ 0 & 0 & 0 & 0 & 0.5995 & 1.000 & 0 & 0 \\ 0 & 0 & 0 & 0 & -0.351 & 0.5995 & 0.5000 & 0 \\ 0 & 0 & 0 & 0 & 0 & 0 & 0.5788 & 0.2500 \\ 0 & 0 & 0 & 0 & 0 & 0 & -0/0149 & 0.5788 \end{pmatrix}$$

B=(0 0 0 0 0 0 0 0.3563)T
C=(0.2226 0 0.1032 0 0.0445 0 0 0)
D=(0)

The frequency response plots of the filter with the unaltered A matrix and with $A^{1/2}$ are illustrated in FIG. 15. Again, it confirms that the STF implements a low-pass filter with the frequency-scaling property.

Figure 20:
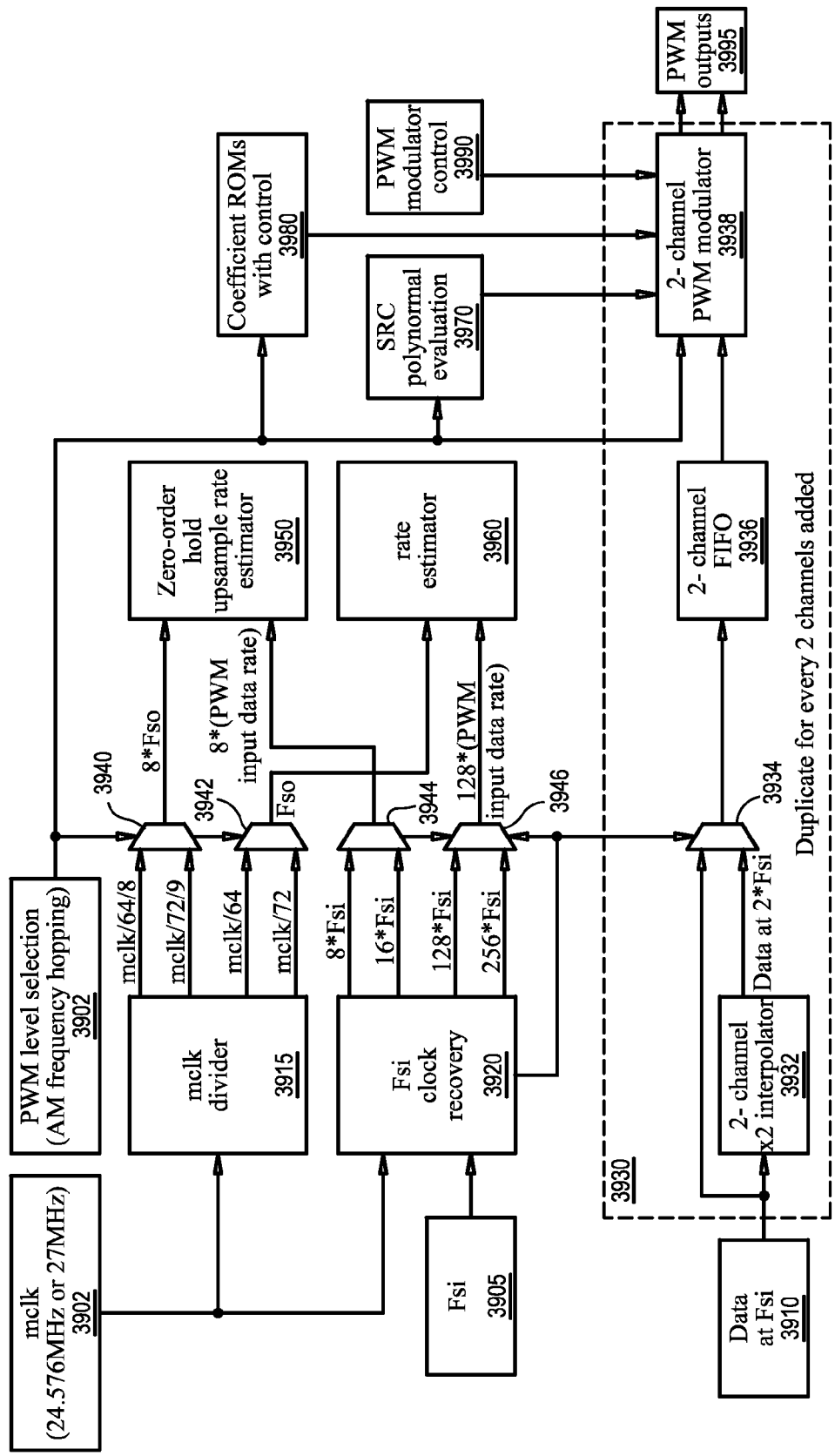

Now that it is established that the STF of the DSM performs as a frequency-scaling low- pass filter, all the discussion presented in previous sections can directly be applied. In one application, an SRC+PWM module is actually built using the DSM shown in FIG. 19. FIG. 20 shows the block diagram of the module. In FIG. 20, the overall block 3930 together with blocks 3980, 3970, and 3990 makes up FIG. 18. The operations of blocks 3932 and 3936 are to address the "two limiting assumptions" previously described. The rest of the blocks 3915, 3920, 3950, and 3960 are the auxiliary blocks to support the main data path operation. Blocks 3950 and 3960 are to determine the appropriate zero-order hold rate for the FIFO. Blocks 3915 and 3920 together with the following 4 multiplexers 3940, 3942, 3944, and 3946 are to generate necessary clocks; these blocks especially play another role that led to another invention filed the other day (PWM level switching).

The module integrates many other features into the same DSM, which may not be directly related to the invention, including: PWM nonlinearity correction feedback, Fso so frequency hopping by switching quantization levels between 65 and 73 to avoid AM frequency interference, and single master clock operation that does not require any other oversampling $F_{si}$ and $F_{so}$ clocks. The module achieves <-90 dB typical THD+N with a >90% modulation index. On an emulation platform that utilizes the Philips power stages, it shows a >102 dB dynamic range. The synthesized cell area, which includes all the synthesized RAM's, occupies 0.57 mm2 in the ZK2D5 process, excluding the interpolator and ROM's.

The derivation described herein shows polynomials of increasing degree from left to right across the filter. However, in actual application, some of these polynomials may be removed altogether, or at least reduced in their degree, and still meet the required performance. The amount of reduction depends on the particular implementation. One of the main components which determines the amount of reduction is the oversampling ratio going into the filter. Thus, for a delta-sigma modulator without PWM (where the oversampling ratio might be 256), the approximations can be more crude than for a design with PWM (where the oversampling ratio might be 8). With the PWM running at a lower rate, more accuracy may be required. If a high oversample ratio is used, then fewer approximations are required.

The technique for determining the polynomial equations has been described previously. The continuous curves for the polynomials are achieved as N becomes infinite. In application, N may be set to a reasonable number, and a Matlab™ function may be used to find the polynomial coefficients for the given order that makes the polynomial curve "best fit" the N values points. The "best fit" is in the sense that the mean-square error becomes minimal. The exact number used for N largely does not make much difference, and there are minimal trade-offs between this procedure and the sample rate.

In making approximations based on the specific PWM implementation, one implementation detail that should be focused on is the method to satisfy the "Fso/Fsi >½" condition explained previously. As previously mentioned, this condition can easily be made valid by appropriately interpolating and/or zero-order-holding the Fsi samples, effectively rendering the input frequency that the SRC sees. The realization of this idea may be achieved by rate estimator 3960 in FIG. 20, together with the zero-order hold upsample rate estimator 3950. These circuits may also be used for a CS8421 sample-rate converter but here the context is slightly different because the "Fso/Fsi >½" condition may not exist for the CS8421.

There are other techniques of implementing the present invention. One approach is to evaluate the polynomials on the fly, in which case reducing polynomial degree is important to reduce computation complexity. Another way is to use a table lookup, in which case there is probably no advantage to reducing polynomial degree.

While the preferred embodiment and various alternative embodiments of the invention have been disclosed and described in detail herein, it may be apparent to those skilled in the art that various changes in form and detail may be made therein without departing from the spirit and scope thereof.

We claim:

1. A method of of converting input data samples provided at a first sample rate to an analog output signal, comprising the steps of:
    converting, by a Delta Sigma Modulator (DSM) in a Digital to Analog Converter (DAC), where internal states of the DSM are updated at a second sample rate unequal to the first sample rate, the input data samples to produce output data samples at the second sample rate;
    in response to a new input sample arriving at a time different from an update of the internal states of the DSM, modifying at least one internal state of the DSM to account for the time difference; and
    converting the output samples to an analog output signal, wherein the step of modifying comprises the step of modifying the at least one internal state in response to an amount of time elapsing between when an input data sample arrives and the update of the internal states of the DSM.

2. The method of claim 1, wherein the input changes value no more than once per update of the internal states of the DSM.

3. The method of claim 1, wherein the DAC comprises a Multiple Element DAC.

4. The method of claim 1, wherein the at least one internal state comprises at least one element of vector X, vector X representing current states, vector X' representing what the states will be at the next point in time, vector U representing an input to the filter, and vector Y representing output of the filter, and matrices A, B', C, and D determine how the states variables are updated and how outputs are made from the internal states, wherein internal state descriptions are represented as $X'=AX+B'U$ $Y=CX+DU$ $X=z^{-1}X'$ wherein the B' matrix comprises a column matrix whose elements are polynomials in $z^{-1}$.

5. The method of claim 4, wherein the B' matrix comprises a column matrix whose elements are polynomials of the time difference, wherein the polynomials are of increasing degree.

6. A method of claim of converting input data samples provided at a first sample rate to an analog output signal, comprising the steps of:
    converting, by a Delta Sigma Modulator (DSM) in a Digital to Analog Converter (DAC), where internal states of the DSM are updated at a second sample rate unequal to the first sample rate, the input data samples to produce output data samples at the second sample rate;
    in response to a new input sample arriving at a time different from an update of the internal states of the DSM, modifying at least one internal state of the DSM to account for the time difference; and
    converting the output samples to an analog output signal, wherein the step of modifying comprises the step of modifying the at least one internal state in response to a difference in input value before the input data sample arrives at a time different from the update of the internal states of the DSM, and the input value after the input data sample arrives at a time different from the update of the internal states of the DSM.

7. A method of converting input data samples provided at a first sample rate to an analog output signal comprising the steps of:
    converting, by a Delta Sigma Modulator (DSM) in a Digital to Analog Converter (DAC), where internal states of the DSM are updated at a second sample rate unequal to the first sample rate, the input data samples to produce output data samples at the second sample rate;
    in response to a new input sample arriving at a time different from an update of the internal states of the DSM, modifying at least one internal state of the DSM to account for the time difference; and
    converting the output samples to an analog output signal, wherein the DAC further comprises a Pulse Width Modulator (PWM).

8. The method of claim 7 wherein the DSM further comprises a plurality of non-linear correction terms in a modulator feedback.

9. A method of converting input data samples provided at a first sample rate to an analog output signal, comprising the steps of:
    converting, by a Delta Sigma Modulator (DSM) in a Digital to Analog Converter (DAC), where internal states of the DSM are updated at a second sample rate unequal to the first sample rate, the input data samples to produce output data samples at the second sample rate, the first and second sample rates being either an integer multiple of one another or not an integer multiple of one another;
    when the first and second sample rates are not an integer multiple of one other, in response to a new input sample arriving at a time different from an update of the internal states of the DSM, modifying at least one internal state of the DSM to account for the time difference; and
    converting the output samples to an analog output signal, wherein the DAC comprises a Multiple Element DAC, and
    wherein the Multiple Element DAC further comprises Dynamic Element Matching circuitry.

10. An apparatus for converting input data samples provided at a first sample rate to analog output signals the apparatus comprising:
- a Delta Sigma Modulator (DSM) having internal states that are updated at a second sample rate unequal to the first sample rate, filtering the input data samples to produce output data samples at the second sample rate;
- sample rate conversion compensation circuitry for modifying at least one internal state of the DSM in response to a new input sample arriving at a time differing from the update of the internal states of the DSM, to account for the time difference; and
- a Digital to Analog Converter (DAC) for converting the output data samples at the second sample rate to an analog output signal,
- wherein the sample rate conversion compensation circuitry modifies the at least one internal state in response to an amount of time elapsing between when an input data sample arrives and updates of the internal states of the DSM.

11. The apparatus of claim 10, wherein the input changes value no more than once per update of the internal states of the DSM.

12. The apparatus of claim 10, wherein the DAC comprises a Multiple Element DAC.

13. The apparatus of claim 10, wherein the at least one internal state comprises at least one element of vector X, vector X representing current states, vector X' representing what the states will be at the next point in time, vector U representing an input to the filter, and vector Y representing output of the filter, and matrices A, B', C, and D determine how the states variables are updated and how outputs are made from the internal states, wherein internal state descriptions are represented as $$X'=AX+B'U$$

$$Y=CX+DU$$

$$X=z^{-1}X'$$

wherein the B' matrix comprises a column matrix whose elements are polynomials in $z^{-1}$.

14. The apparatus of claim 13, wherein the B' matrix comprises a column matrix whose elements are polynomials of the time difference, wherein the polynomials are of increasing degree.

15. An apparatus for converting input data samples provided at a first sample rate to analog output signals, the apparatus comprising:
- a Delta Sigma Modulator (DSM) having internal states that are updated at a second sample rate unequal to the first sample rate, filtering the input data samples to produce output data samples at the second sample rate;
- sample rate conversion compensation circuitry for modifying at least one internal state of the DSM in response to a new input sample arriving at a time differing from the update of the internal states of the DSM, to account for the time difference; and
- a Digital to Analog Converter (DAC) for converting the output data samples at the second sample rate to an analog output signal,
- wherein the sample rate conversion compensation circuitry modifies the at least one internal state in response to a difference in input value before the input data sample arrives at a time different from the update of the internal states of the DSM, and the input value after the input data sample arrives at a time different from the update of the internal states of the DSM.

16. An apparatus for converting input data samples provided at a first sample rate to analog output signals, the apparatus comprising:
- a Delta Sigma Modulator (DSM) having internal states that are updated at a second sample rate unequal to the first sample rate, filtering the input data samples to produce output data samples at the second sample rate;
- sample rate conversion compensation circuitry for modifying at least one internal state of the DSM in response to a new input sample arriving at a time differing from the update of the internal states of the DSM, to account for the time difference; and
- a Digital to Analog Converter (DAC) for converting the output data samples at the second sample rate to an analog output signal,
- wherein the DAC further comprises a Pulse Width Modulator (PWM).

17. The apparatus of claim 16, wherein the DSM further comprises a plurality of non-linear correction terms in a modulator feedback.

18. An apparatus for converting input data samples provided at a first sample rate to analog output signals the apparatus comprising:
- a Delta Sigma Modulator (DSM) having internal states that are updated at a second sample rate unequal to the first sample rate, filtering the input data samples to produce output data samples at the second sample rate;
- sample rate conversion compensation circuitry for modifying at least one internal state of the DSM in response to a new input sample arriving at a time differing from the update of the internal states of the DSM, to account for the time difference; and
- a Digital to Analog Converter (DAC) for converting the output data samples at the second sample rate to an analog output signal,
- wherein the DAC comprises a Multiple Element DAC, and
- wherein the Multiple Element DAC further comprises Dynamic Element Matching circuitry.

* * * * *